United States Patent [19]

Colman et al.

[11] Patent Number: 4,601,202

[45] Date of Patent: Jul. 22, 1986

[54] GAS TURBINE ENGINE COMPONENT COOLING SYSTEM

[75] Inventors: Michael E. Colman, Wakefield; Robert E. Goeller, Beverly, both of Mass.

[73] Assignee: General Electric Company, Lynn, Mass.

[21] Appl. No.: 695,334

[22] Filed: Mar. 15, 1985

Related U.S. Application Data

[62] Division of Ser. No. 565,942, Dec. 27, 1983.

[51] Int. Cl.[4] .............................................. G01L 19/14
[52] U.S. Cl. ...................................... 73/431; 60/39.83; 361/382
[58] Field of Search ...................... 73/431; 165/53, 56, 165/57, 80.3, 32; 60/226.1, 266, 39.83, 39.07; 361/383, 384

[56] References Cited

U.S. PATENT DOCUMENTS

| 2,477,798 | 8/1949 | Griffith | 60/262 |
|---|---|---|---|
| 2,597,822 | 5/1952 | Rozen | 165/51 |
| 2,652,216 | 9/1953 | Hoffman | 60/39.83 |
| 3,004,196 | 10/1961 | Drexel | 357/82 |
| 3,011,105 | 11/1961 | Le Blanc | 357/82 |
| 3,253,646 | 5/1966 | Koltuniak et al. | 165/39 |
| 3,299,946 | 1/1967 | Recklinghausen | 165/80.3 |
| 3,416,597 | 12/1968 | Kupferberg | 165/80.3 |
| 3,417,575 | 12/1968 | Stark | 324/99 R |
| 3,623,546 | 11/1971 | Banthin et al. | 165/51 |
| 3,780,798 | 12/1973 | Reimer | 165/47 |
| 4,050,093 | 9/1977 | Crall et al. | 361/383 |
| 4,254,618 | 3/1981 | Elovic | 60/226.1 |
| 4,258,545 | 3/1981 | Slater | 60/226.1 |
| 4,351,150 | 9/1982 | Schulze | 60/226.1 |
| 4,356,864 | 11/1982 | Ariga et al. | 361/383 |
| 4,502,100 | 2/1985 | Greenspan et al. | 361/384 |
| 4,504,030 | 3/1985 | Kniat et al. | 60/39.83 |

FOREIGN PATENT DOCUMENTS

1358076 6/1974 United Kingdom.

*Primary Examiner*—Jerry W. Myracle
*Assistant Examiner*—Robert R. Raevis
*Attorney, Agent, or Firm*—Francis L. Conte; Derek P. Lawrence

[57] ABSTRACT

The invention comprises a system for cooling a component in a gas turbine engine, and, in particular, for cooling an engine electronic control thereof. The cooling system includes a housing for mounting the control having a plurality of heat transfer fins extending outwardly therefrom. The housing is mounted in the engine upstream of a compressor and to a front frame having an aperture through which the fins extend. The front frame defines a flowpath to the compressor and the fins extend into the flowpath without adversely affecting the aerodynamic airflow pattern thereof. In a preferred embodiment, the fins extend substantially only to an inner surface of the front frame, and the housing includes temperature and pressure sensors disposed below root sections of the fins.

17 Claims, 5 Drawing Figures

GAS TURBINE ENGINE COMPONENT COOLING SYSTEM

The U.S. Government has rights in this invention pursuant to Contract No. DAAK51-83-C-0014 awarded by the Department of the Army.

This application is a division of application Ser. No. 565,942, filed Dec. 27, 1983.

BACKGROUND OF THE INVENTION

This invention relates generally to a cooling system for a gas turbine engine component, and, more particularly, to a cooling system for an electronic engine control.

The sophistication of gas turbine engines has developed to the utilization of electronic engine controls to supplement, and in some cases replace, hydromechanical engine controls for providing improved safety and higher efficiency of operation. However, an electronic control module is more sensitive to temperature than is a hydromechanical control and therefore requires a greater degree of cooling to maintain its reliability in normal operation and to prolong its useful service life.

Conventional cooling systems are relatively complex and may adversely affect the overall efficiency of the engine. Various heat sink sources have been utilized and include singly or in combination freestream or outside airflow, fan or compressor bleed air and even engine fuel. An example of a conventional manner of keeping the module cool on a gas turbine engine, such as a turboshaft engine, is to install the module in an airframe nacelle or on an engine frame, that is, the external, metallic structure of the engine, where the temperature is relatively low. On a turbofan engine, the module can be installed in the annular airspace within the nacelle between the fan casing and the nacelle where, because this portion of the nacelle is spaced away from the engine core, the temperature is lower than it is immediately adjacent the core.

However, the temperature in the airframe nacelle of a gas turbine engine is still too warm to enable best, long-life operation unless supplemental cooling is utilized. Such supplemental cooling can be obtained by blowing air across the module, and is most advantageous if the coolest air available is utilized to obtain the greatest amount of cooling.

The source of air commonly used for cooling engine components such as an electronic control module is air bled from the initial stages of the compressor of the engine, or, in a turbofan engine, fan air from behind the fan. The air from each of these sources has pressure increased by the compressor or fan, and is thus warmer and consequently a less desirable source of cooling air than is the unpressurized, unheated outside freestream air surrounding the engine nacelle. Furthermore, if ram air, that is, the freestream air which is forced into an aircraft engine as the aircraft moves through the air, is utilized for cooling, there is no flow of air when the aircraft is stationary on the ground.

Another conventional manner of cooling an engine electronic control is disclosed in U.S. Pat. No. 4,351,150—W. M. Schulze, assigned to the present assignee. The auxiliary cooling air system disclosed therein represents an improvement over prior art systems. However, the Schulze system is relatively complex and includes additional air plumbing and a jet pump which also uses compressor bleed air for moving outside air over the electronic control. Of course, it will be appreciated that the use of bleed air in any cooling system reduces the overall gas turbine engine efficiency.

Yet other conventional systems for cooling electronic components, in general, include various heat dissipating fin structures, some of which extend into a flow channel through which cooling air is driven by an auxiliary fan. However, the use of fin structures disposed directly in the flowpath inside a gas turbine engine is not known, inasmuch as any obstructions in the flowpath might adversely affect the desired aerodynamic flow patterns in the inlet to the fan or compressor, for example.

Another important function in the efficient operation of a gas turbine engine involves the determination of engine inlet air temperature and pressure. The thrust or shaft horsepower developed by a gas turbine engine and the engine control settings are dependent in part upon the temperature and pressure of the air entering the engine. Consequently, this inlet air must be measured to adjust the fuel flow into the engine for obtaining the desired output power.

Inlet air temperature and pressure sensors are commonly located at positions on the engine nacelle upstream of the engine compressor, and upstream of the fan in the case of a turbofan engine, such that the sensors are directly exposed to the engine inlet airstream. However, this placement can result in inaccurate readings or even loss of temperature and pressure measuring capability. For example, the sensors may accumulate an ice coating at some atmospheric conditions, or they may experience foreign object damage from bird strikes or earth particles impinging upon the sensors.

An even more serious difficulty may arise if the sensors are located on the inner surface of the engine inlet cowl. If a sensor, or part of one, breaks off, as could occur, for example, during a bird strike, the loose piece would be ingested by the fan or compressor and could cause serious damage or even lead to engine failure. Therefore, anti-icing systems and foreign object protection devices are conventionally utilized for protecting these measurement devices.

Accordingly, it is an object of the present invention to provide a new and improved component cooling system for a gas turbine engine.

Another object of the present invention is to provide an electronic engine control cooling system which does not require an auxiliary air source or bleed air for providing cooling.

Another object of the present invention is to provide a cooling system which is relatively simple and which uses engine inlet air as a cooling fluid.

Another object of the present invention is to provide a cooling system which directly incorporates and protects temperature and pressure measurement sensors.

SUMMARY OF THE INVENTION

The invention comprises a system for cooling a component in a gas turbine engine, and, in particular, for cooling an engine electronic control thereof. The cooling system includes a housing for mounting the control having a plurality of heat transfer fins extending outwardly therefrom. The housing includes at least one environmental sensor means disposed adjacent to the fins for sensing a characteristic of a cooling fluid flowable over the fins. In a preferred embodiment, the housing includes temperature and pressure sensors disposed below root sections of the fins.

BRIEF DESCRIPTION OF THE DRAWING

The invention, together with further objects and advantages thereof, is more particularly described in the following detailed description taken in conjunction with the accompanying drawings in which.

DETAILED DESCRIPTION

Figure 1:
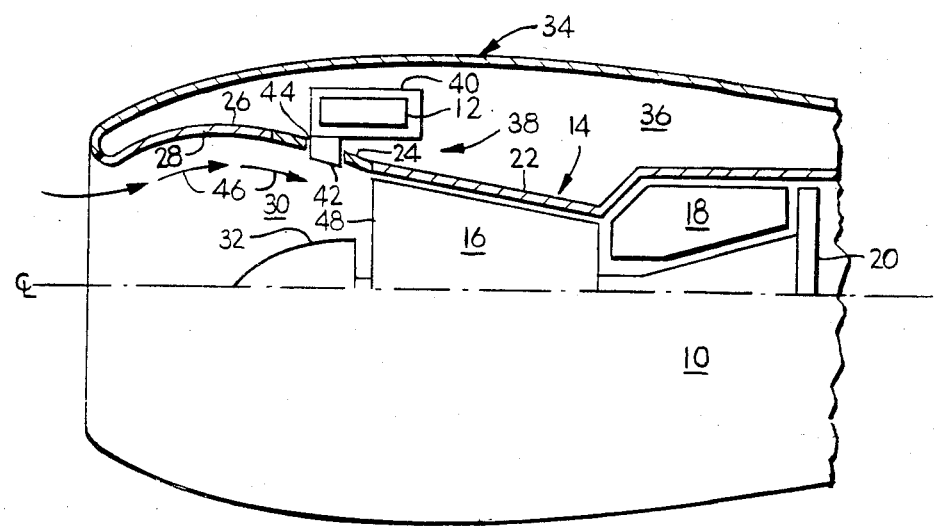
FIG. 1 is a partly sectional view of an aircraft gas turbine engine including a cooling system according to one embodiment of the present invention.

Illustrated in FIG. 1 is a partly sectional view of an exemplary aircraft gas turbine engine 10 including a system for cooling an engine component, for example, an engine electronic control 12, in accordance with one embodiment of the present invention. More specifically, the engine 10 includes a core engine 14 having a compressor 16, combustor 18, and turbine 20 disposed in serial flow relationship along an engine longitudinal centerline. The core engine 14 is supported in an annular frame or casing 22 which includes a front frame portion 24 extending forward or upstream of the compressor 16. The front frame 24 includes a radially outer surface 26 and a radially inner surface 28, the inner surface 28 defining an annular flowpath 30 to the compressor 16.

The engine 10 may also include an annular inner frame 32 also extending in an upstream direction from the compressor 16 which defines an inner boundary of the flowpath 30. Disposed radially outwardly and spaced from the core engine 14 is an airframe nacelle 34 which provides an outer skin for the engine 10 and which defines a nacelle cavity 36 between the nacelle 34 and the casing 22. Except for an engine component cooling system in accordance with the present invention, and as indicated generally at 38, the engine 10 is otherwise conventional and will not be described in further detail.

The engine component cooling system 38 in accordance with the present invention provides a relatively simple and effective cooling system, especially suited for cooling the engine electronic control 12. The cooling system 38 includes a suitably shaped housing 40 in which the electronic control 12 is suitably mounted and a plurality of heat transfer fins 42 extending outwardly from the housing 40. The cooling system 38 also includes an aperture 44 which extends through the front frame 24 and through which is positioned the heat transfer fins 42 of the housing 40. The housing 40 is suitably mounted to the radially outer surface 26 of the front frame 24 so that the fins 42 extend through the aperture 44 and into the flowpath 30.

In operation, the electronic control 12 is subject to relatively high temperatures found in the nacelle cavity 36 as well as those generated from the electronic control 12 itself. Heat is thermally transferred from the electronic control 12 to the housing 40 and dissipated through the fins 42 to relatively cool, freestream inlet airflow 46 which enters the engine 10 and is channeled through the flowpath 30 to the compressor 16. The compressor 16, itself, acts as a driver of the airflow 46 whether the engine is stationary on the ground or in an aircraft in flight.

It will be appreciated that for efficient operation of the engine 10, the flowpath 30 is conventionally designed for minimizing obstructions to the airflow 46 for preventing undesirable aerodynamic airflow patterns at an inlet 48 of the compressor 16 which might adversely affect the performance of the compressor 16. Accordingly, the cooling system 38 according to the present invention includes features as hereinbelow described which reduce any adverse effect of disposing the fins 42 in the flowpath 30. More specifically, and referring to FIGS. 1 and 3, it has been discovered that the fins 42 need only extend into the flowpath 30 a relatively short distance with respect to the radial extent of the flowpath 30 to be effective for dissipating heat from the housing 40 and without adversely affecting the performance of the compressor 16. Preferably, the fins 42 extend into the flowpath 30 substantially only to the inner surface 28 of the front frame 24. It is not necessary nor is it desirable for the fins 42 to extend into the flowpath 30 any substantial distance which would adversely affect the performance of the compressor 16.

Of course, the required amount of extension of the fins 42 into the flowpath 30 must be determined for each engine application. However, it is known to those skilled in the art that during engine operation airflow flowing along the inner surface 28 will generate a surface airflow boundary layer 50 having a thickness B. It is preferred that the fins 42 extend into the flowpath 30 at least the thickness B of boundary layer 50 for the effective transfer of heat from the fins 42. For example only, in a gas turbine engine 10 rated at about 5000 shaft horsepower and having an electronic control 12 dissipating approximately 60 watts of power, the fins 42 need only extend beyond the inner surface 28 and into the flowpath 30 a distance of about 5.0 millimeters, which when compared to the radial extent of the flowpath 30 of about 2500 millimeters, is, therefore, an extension to substantially the inner surface 28.

Figure 2:
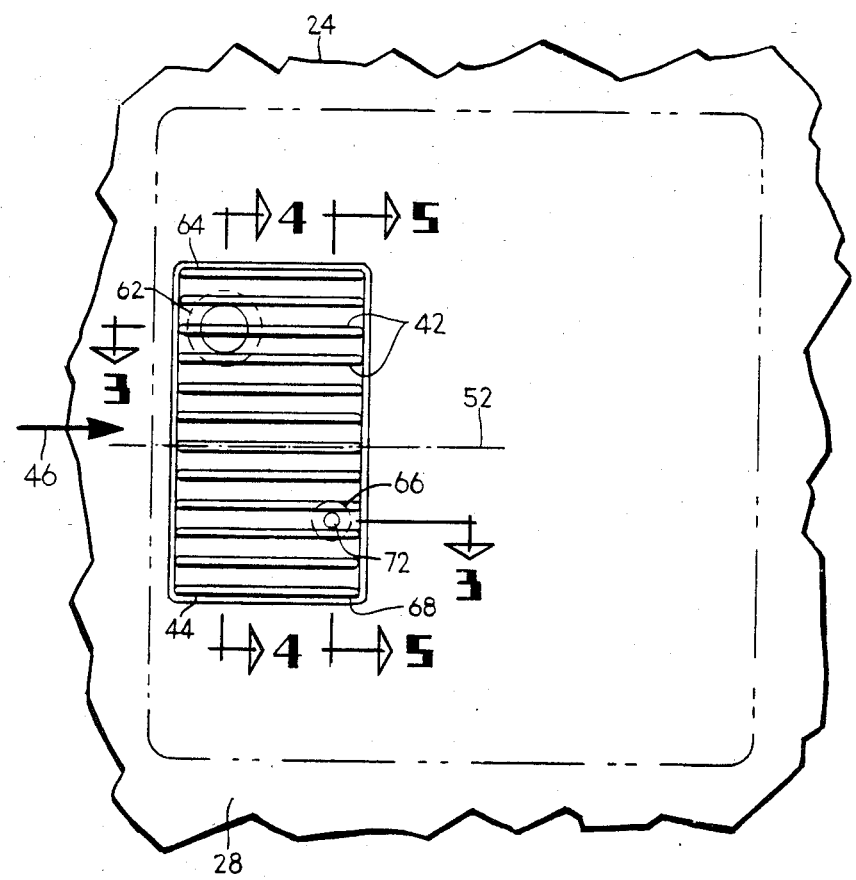
FIG. 2 is a bottom view of the cooling system of FIG. 1.
Figure 3:
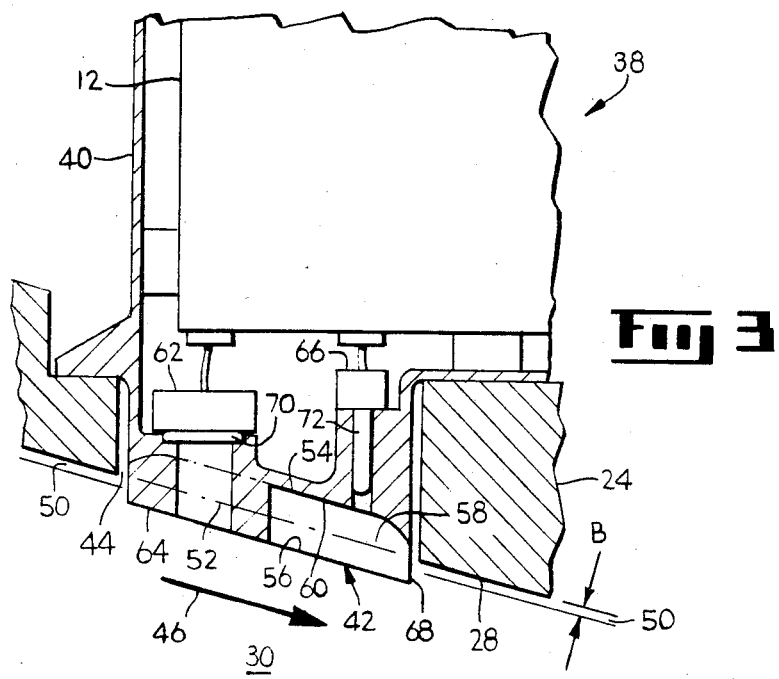
FIG. 3 is a partly sectional side view of the cooling system of FIG. 1 taken along line 3—3 of FIG. 2.
Figure 4:
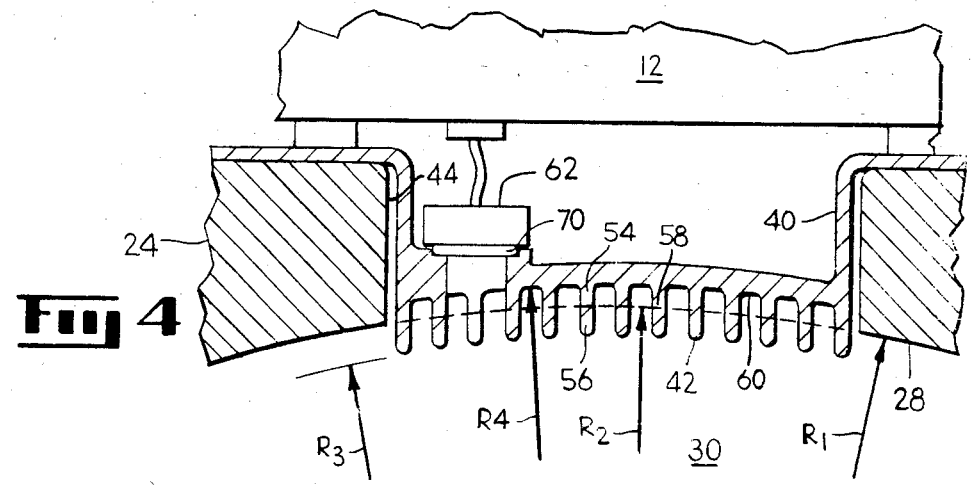
FIG. 4 is a sectional front view of the cooling system of FIG. 2 taken along line 4—4.

Illustrated in FIGS. 2, 3 and 4 is a preferred embodiment of the invention having fins 42 which are aerodynamically shaped for minimizing any obstruction of the airflow 46 in the flowpath 30. More specifically, the fins 42 include a plurality of substantially parallel, spaced rectangular fins 42 each having a longitudinal centerline axis 52 aligned substantially parallel to the direction of travel of the airflow 46 in the flowpath 30. FIGS. 2 and 3 illustrate bottom and side views, respectively, of the fins 42 illustrating this preferred alignment of the fins 42 to the airflow 46 in these two planes. In FIGS. 2 and 3, the front frame 24 and the airflow 46 are inclined relative to the engine longitudinal centerline axis and, accordingly, the longitudinal axis 52 of the fins 42 is aligned parallel to the frame 24 and the airflow 46.

Illustrated in more particularity in FIGS. 3 and 4, the fins 42 further include a root section 54 and a tip section 56 disposed at opposite transverse ends thereof. A center section 58 is disposed equidistantly between the root section 54 and the tip section 56 and is coextensive with the longitudinal axis 52. The root section 54 is fixedly connected to an outer surface 60 of the housing 40 and is preferably integral therewith. The tip section 56 is disposed in the flowpath 30 and is aligned substantially parallel to and spaced radially inwardly from the inner surface 28 of the front frame 24 (see FIG. 3).

FIG. 4 illustrates a representative transverse section of the frame 24, housing 40 and fins 42. In this section, the inner surface 28 of the front frame 24 is disposed at a first radius $R_1$ from the longitudinal centerline of the engine 10. The center sections 58 of the fins 42 are aligned coextensively with the inner surface 28 and along a second radius $R_2$ which is substantially equal in magnitude to the first radius $R_1$. Where substantially identical fins 42 are used, this arrangement is effective so that the tip sections 56 are aligned along a third radius $R_3$ which is less than the second radius $R_2$ and is substantially concentric with and spaced radially inwardly from the inner surface 28 of the front frame 24. Of course, differently sized fins 42 may be used, however, it is preferred that the tip sections 56 be aligned along the third radius $R_3$ and in the flowpath 30 to provide for a more aerodynamcially smooth alignment of the fins 42 for minimizing the obstruction of airflow 46 in the flowpath 30.

Furthermore, the root sections 54 are generally aligned concentric with and spaced radially outwardly, or recessed from the inner surface 28 of the front frame 24, at a fourth radius $R_4$ which is greater than the first radius $R_1$. In this preferred arrangement, a portion of the fins 42 extend into the flowpath 30 and a portion remains recessed below the inner surface 28. However, airflow 46 will flow into the aperture 44 and between the root sections 54 of the fins 42 for the cooling thereof. This recessed feature of the fins 42 allows for increasing cooling efficiency thereof which would otherwise be obtainable by fins 42 extending farther into the flowpath 30.

Another significant feature in accordance with the present invention is the incorporation of at least one environmental sensor in the housing 40 adjacent to the fins 42 for measuring characteristics of the airflow 46 in the flowpath 30. More specifically, FIG. 2 illustrates the placement of two environmental sensors: a temperature sensor 62 disposed at an upstream end 64 of the fins 42, and a pressure sensor 66 disposed at a downstream end 68 of the fins 42.

The sensors 62 and 66 are disposed in the housing 40 and are suitably electrically connected to the electronic control 12 housed therein. In this manner, additional wiring and protective devices that would otherwise be required are not needed. Furthermore, sensors 62 and 66 are protected from foreign object damage by the fins 42 themselves, which, being rectangular, are relatively strong. Inasmuch as the fins 42 conduct heat away from the housing 40 during operation, anti-icing of the sensors 62 and 66 is inherently provided without the necessity of the additional structures ordinarily provided for anti-icing of environmental sensors in an engine.

Figure 5:
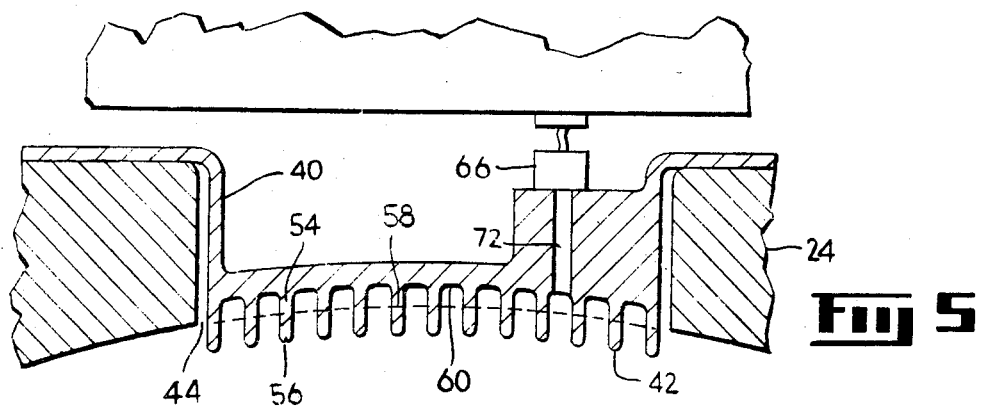
FIG. 5 is a sectional front view of the cooling system of FIG. 2 taken along line 5—5.

As illustrated in FIGS. 3, 4, and 5, the sensors 62 and 66 are preferably disposed in the housing 40 and at or below the root sections 54 for providing, for example, increased foreign object protection. FIGS. 3 and 4 illustrate the preferred placement of the temperature sensor 62. In particular, the temperature sensor 62 is placed at the upstream end 64 (see FIG. 2) of the fins 42 so that the temperature sensor 62 senses primarily the temperature of the airflow 46 prior to be being heated by the fins 42. Furthermore, the temperature sensor 62 is mounted in the housing 40 below the outer surface 60 with a suitable passageway connected thereto, or, alternatively, at the outer surface 60, and is thermally isolated therefrom by suitable thermal insulation 70. Accordingly, the temperature sensor 62 will be effective for measuring the temperature of the airflow 46 in the flowpath 30 with relatively small inaccuracies due to the heating effect of the fins 42.

The pressure sensor 66 is shown in more detail in FIGS. 3 and 5. The pressure sensor 66 is disposed at the downstream end 68 (see FIG. 2) of the fins 42. The housing 40 preferably includes a passageway 72 extending from the outer surface 60 to the sensor 66 for channeling airflow 46 from between the fins 42 to the sensor 66.

Accordingly, a cooling system 38 according to the present invention provides a relatively simple and effective system for cooling the electronic control 12 which uses the airflow 46 drawn into the compressor 16 as a heat sink medium. The cooling system 38 includes the preferred heat transfer fins 42 which are effective for dissipating heat from the electronic control 12 without adversely affecting the preferred aerodynamic pattern of the airflow 46 to the compressor 16. Furthermore, by mounting the sensors 62 and 66 directly in the housing 40 at the root sections 54 of the heat transfer fins 42 the additional wiring, plumbing and protection required by the prior art are no longer necessary. Furthermore, the fins 42 provide for foreign object damage protection of the sensors 62 and 66 as well as providing for inherent anti-icing features which are both significant improvements over the prior art.

Although a preferred embodiment of the present invention has been disclosed, other embodiments will become apparent to those skilled in the art from the teachings herein. For example, the cooling system 38 may also be utilized in a turbofan engine and may be placed forward of the fan thereof or between the fan and compressor section. Other types of fin arrangements may also be used as long as they are sufficiently strong, such as the preferred rectangular fins 42, to reduce to a minimum the possibility of foreign object damage of the fins 42, which, if broken, would be ingested into the compressor 16 possibly having adverse effects in the engine 10.

Having thus described the invention, what is desired to be secured by Letters Patent of the United States is:

1. An electronic control apparatus poitionable in a cooling fluid environment comprising:
   a housing for containing an electronic control having an outer surface;
   a plurality of heat transfer fins extending from said outer surface of said housing and positionable in said cooling fluid environment for cooling said fins and housing;
   environmental sensor means disposed in and connected to said housing adjacent to said heat transfer fins and being connectible to said electronic control; and
   said sensor means being positioned in said housing in flow communication with said cooling fluid flowable over said fins for sensing a characteristic of primarily said cooling fluid environment.

2. An electronic control apparatus according to claim 1 wherein said plurality of heat transfer fins comprise a plurality of substantially parallel spaced rectangular fins each having a longitudinal axis and root and tip sections disposed at transverse opposite ends thereof, said root section being fixedly connected to said outer surface of said housing, said sensor being disposed in said housing and below said root sections.

3. An electronic control apparatus according to claim 2 wherein said housing further includes channeling means extending from said outer surface to said sensor means for channeling said cooling fluid from between said fins to said sensor means.

4. An electronic control apparatus according to claim 3 wherein said sensor means comprises a temperature sensor being thermally insulated from said housing.

5. An electronic control apparatus according to claim 4, wherein each of said fins has an upstream end and a downstream end positionable in said cooling fluid environment for allowing said cooling fluid to flow parallel to said longitudinal axis from said fin upstream end to said fin downstream end, and wherein said temperature sensor is mounted in said housing adjacent to an upstream end of at least one of said fins.

6. An electronic control apparatus according to claim 3 wherein said sensor means comprises two environmental sensors disposed in and connected to said housing including a temperature sensor and a pressure sensor, and said channeling means comprises two passageways, each extending from a respective one of said two sensors to said housing outer surface.

7. An electronic control apparatus according to claim 3 wherein said sensor means comprises a pressure sensor.

8. An electronic control apparatus according to claim 7, wherein each of said fins has an upstream end and a downstream end positionable in said cooling fluid environment for allowing said cooling fluid to flow parallel to said longitudinal axis from said fin upstream end to said fin downstream end, and wherein said channeling means comprises a passageway extending from said pressure sensor to a position equidistantly spaced between adjacent ones of said fins.

9. An electronic control apparatus according to claim 8, wherein said pressure sensor is mounted in said housing adjacent to a downstream end of at least one of said fins.

10. An electronic control apparatus according to claim 3, wherein said channeling means comprises a passageway extending from said sensor to a position substantially only between adjacent ones of said fins.

11. An electronic control apparatus according to claim 1 wherein said housing further includes a passageway extending from said outer surface to said sensor means for channeling said cooling fluid from between said fins to said sensor means.

12. An electronic control apparatus according to claim 11, wherein said passageway extends from said sensor means to a position substantially only between adjacent ones of said fins.

13. An electronic control apparatus according to claim 1 wherein said sensor means comprises a temperature sensor being thermally insulated from said housing.

14. An electronic control apparatus according to claim 1 wherein said sensor means comprises a pressure sensor.

15. An electronic control apparatus according to claim 1 wherein said sensor means comprises two environmental sensors disposed in and connected to said housing including a temperature sensor and a pressure sensor.

16. An electronic control apparatus according to claim 1 wherein said plurality of fins comprise root sections extending from said outer surface, said sensor means being disposed in said housing and below said root sections.

17. An electronic control apparatus according to claim 16 wherein said housing further includes a passageway extending from said outer surface to said sensor means for channeling said cooling fluid from between said fins to said sensor means.

* * * * *